(12) United States Patent
Okuno et al.

(10) Patent No.: US 7,816,733 B2
(45) Date of Patent: *Oct. 19, 2010

(54) SIC SEMICONDUCTOR HAVING JUNCTION BARRIER SCHOTTKY DEVICE (75) Inventors: Eiichi Okuno, Mizuho (JP); Takeo Yamamoto, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 193 days.

This patent is subject to a terminal disclaimer.

(21) Appl. No.: 12/078,370

(22) Filed: Mar. 31, 2008

(65) Prior Publication Data

US 2008/0277669 A1    Nov. 13, 2008

(30) Foreign Application Priority Data

May 10, 2007    (JP)    ............................. 2007-125594

(51) Int. Cl.
H01L 29/24    (2006.01)
H01L 29/94    (2006.01)

(52) U.S. Cl. ...................... 257/339; 257/340; 257/341; 257/342; 257/343; 257/452; 257/453; 257/471; 257/493; 257/E29.104; 257/E29.27

(58) Field of Classification Search ................. 257/339, 257/492, 493, 340, 341, 342, 343, E29.104, 257/E29.27, 452, 471; 357/453
See application file for complete search history.

(56) References Cited

U.S. PATENT DOCUMENTS

| 7,508,045 B2 | 3/2009 | Nishio et al. |
| 2002/0125482 A1 | 9/2002 | Friedrichs et al. |
| 2008/0258153 A1* | 10/2008 | Yamamoto et al. ............ 257/77 |

2009/0057686 A1    3/2009    Fukuda et al.

FOREIGN PATENT DOCUMENTS

| JP | A-7-086621 | 3/1995 |
| JP | A-10-321879 | 12/1998 |
| JP | A-2000-252478 | 9/2000 |
| JP | A-2000-294804 | 10/2000 |
| JP | A-2001-85704 | 3/2001 |
| JP | A-2002-314099 | 10/2002 |
| JP | A-2003-158259 | 5/2003 |

OTHER PUBLICATIONS

Office Action dated Apr. 28, 2009 from Japan Patent Office in the corresponding JP Application No. 2007-125593 (and English Translation).
Office Action dated Apr. 28, 2009 from Japan Patent Office in the corresponding JP Application No. 2007-125594 (and English Translation).
U.S. Appl. No. 12/078,350, filed Mar. 31, 2008, Okuno et al.
Office Action mailed May 24, 2010 in related U.S. Appl. No. 12/078,350.

* cited by examiner

Primary Examiner—Long K Tran
(74) Attorney, Agent, or Firm—Posz Law Group, PLC (57) ABSTRACT

A semiconductor device having a JBS diode includes: a SiC substrate; a drift layer on the substrate; an insulation film on the drift layer having an opening in a cell region; a Schottky barrier diode having a Schottky electrode contacting the drift layer through the opening and an ohmic electrode on the substrate; a terminal structure having a RESURF layer in the drift layer surrounding the cell region; and multiple second conductive type layers in the drift layer on an inner side of the RESURF layer contacting the Schottky electrode. The second conductive type layers are separated from each other. The second conductive type layers and the drift layer provide a PN diode. Each second conductive type layer has a depth larger than the RESURF layer.

7 Claims, 10 Drawing Sheets

SIC SEMICONDUCTOR HAVING JUNCTION BARRIER SCHOTTKY DEVICE

CROSS REFERENCE TO RELATED APPLICATIONS

This application is based on Japanese Patent Application No. 2007-125594 filed on May 10, 2007, the disclosure of which is incorporated herein by reference. This application is also related to U.S. application Ser. No. 12/078,350, entitled "SIC SEMICONDUCTOR DEVICE HAVING JUNCTION BARRIER SCHOTTKY DIODE," filed on 31 Mar. 2008.

FIELD OF THE INVENTION

The present invention relates to a SiC semiconductor device having a junction barrier Schottky diode.

BACKGROUND OF THE INVENTION

A Schottky barrier diode (i.e., SBD) includes a Schottky electrode, which contacts a semiconductor layer. An interface between the Schottky electrode and the semiconductor layer has a small work function between metallic material composing the Schottky electrode and semiconductor material composing the semiconductor layer. Accordingly, when a reverse voltage is applied to the diode, a leak current in the SBD is larger than a PN junction type diode.

Figure 11:
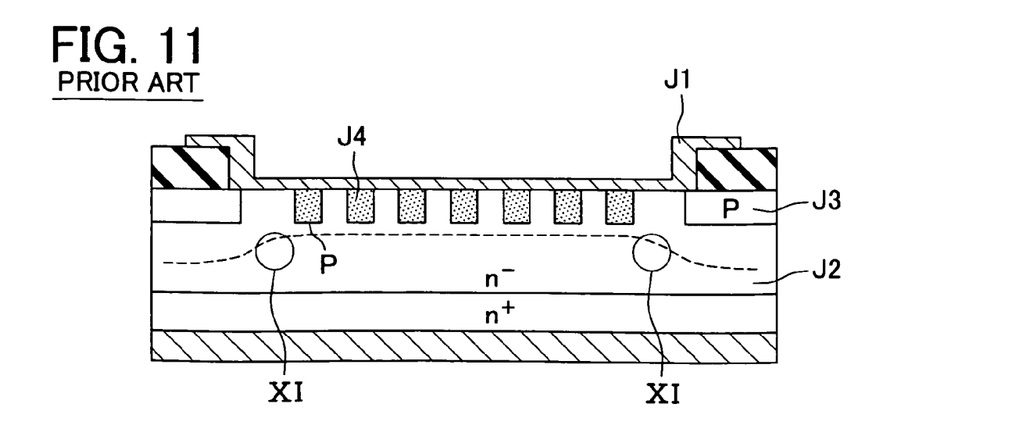
FIG. 11 is a cross sectional view showing a SiC semiconductor device having a JBS structure according to a prior art.

JP-2000-294804 discloses a construction having a Schottky junction and a PN diode. Specifically, the PN diode is formed in a part of the Schottky junction, so that a leak current is reduced when a reverse voltage is applied to the construction. More specifically, as shown in FIG. 11, a Schottky electrode J1 and a N⁻ type drift layer J2 contact with each other at a contact region, which is disposed on an inner side of a RESURF layer J3. The RESURF layer J3 provides a terminal region (i.e., outer periphery breakdown region). A P type layer J4 disposed in a surface portion of the drift layer J2 has a stripe pattern. The P type layer J4 is disposed in the contact region so that the PN diode is formed in the part of the Schottky junction.

However, since the P type layer J4 has the same depth as the RESURF layer J3, a depletion layer expands with an edge shown as a dotted line in FIG. 11 when surge occurs in the device. Thus, the depletion layer approaches the N⁻ type layer J2. Accordingly, electric field is easily concentrated at a portion XI, which is a boundary between the N⁻ type layer J2 and the RESURF layer J3, thereby, the device is easily broken down.

Thus, it is required for the SiC semiconductor device having a JBS (i.e., junction barrier Schottky) diode to protect from breakdown caused by electric field concentration when the surge occurs.

SUMMARY OF THE INVENTION

In view of the above-described problem, it is an object of the present disclosure to provide a SiC semiconductor device having a junction barrier Schottky diode.

According to an aspect of the present disclosure, a semiconductor device having a junction barrier Schottky diode includes: a SiC substrate having a first conductive type and including first and second surfaces; a drift layer having the first conductive type, disposed on the first surface of the substrate, made of SiC, and having an impurity concentration, which is lower than that of the substrate; an insulation film disposed on the drift layer and having an opening in a cell region; a Schottky barrier diode having a Schottky electrode and an ohmic electrode, wherein the Schottky electrode is disposed in the cell region and contacts the drift layer through the opening of the insulation film with Schottky contact, and wherein the ohmic electrode is disposed on the second surface of the substrate; a terminal structure having a RESURF layer and disposed on an outer periphery of the cell region, wherein the RESURF layer has a second conductive type, surrounds the cell region, and is disposed in a surface portion of the drift layer; and a plurality of second conductive type layers, each of which is disposed in another surface portion of the drift layer on an inner side of the RESURF layer, contacts the Schottky electrode, wherein the second conductive type layers are separated from each other by a predetermined distance. The plurality of second conductive type layers and the drift layer provide a PN diode; and each second conductive type layer has a depth, which is larger than a depth of the RESURF layer.

In the above device, a region under multiple second conductive type layers receives the electric field concentration, thereby, the surge current can flow through wide area in the PN diode. Thus, the surge withstand voltage of the device increases.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
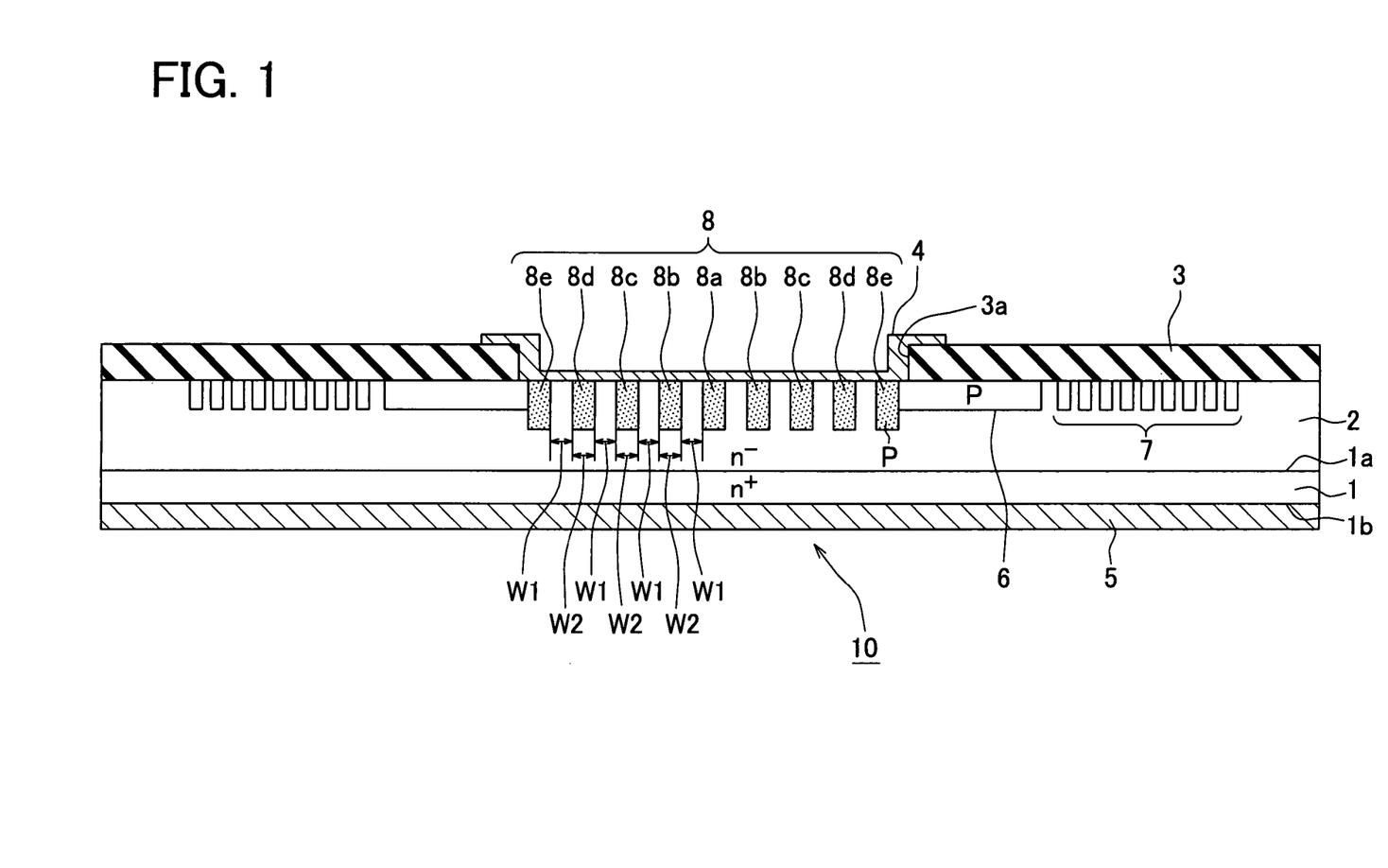
FIG. 1 is a cross sectional view showing a SiC semiconductor device having a JBS structure according to a first embodiment.
Figure 2:
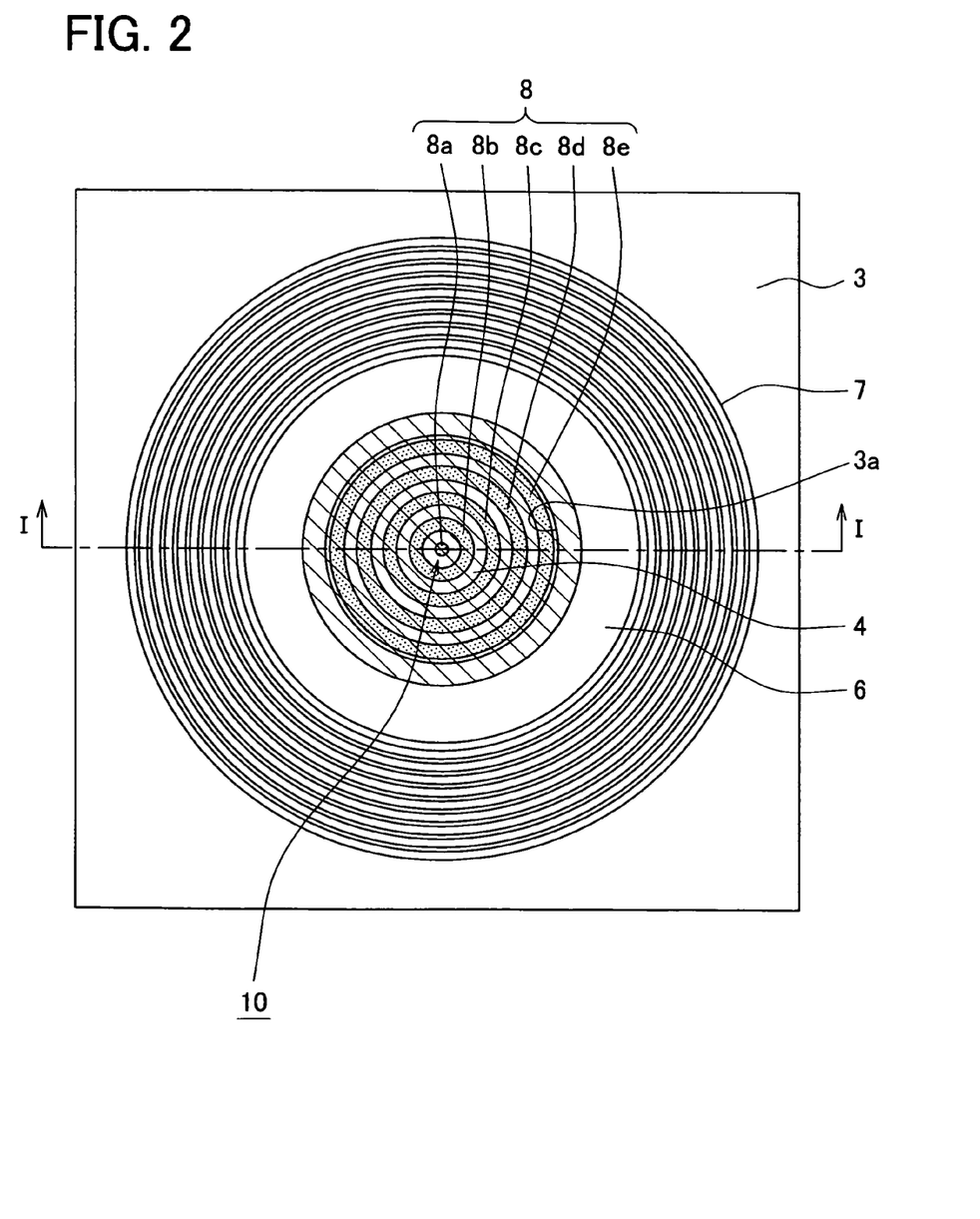
FIG. 2 is an upper layout view showing the SiC semiconductor device shown in FIG. 1.

FIG. 1 is a cross sectional view showing a SiC semiconductor device having a JBS structure taken along line I-I in FIG. 2.

The SiC semiconductor device is made from a N+ type substrate 1 made of SiC and having an impurity concentration, for example, in a range between $2\times10^{18}$ cm$^{-3}$ and $1\times10^{21}$ cm$^{-3}$. The substrate 1 has a principal surface 1a as an upper surface and a backside surface 1b as a lower surface, which is opposite to the principal surface 1a. On the principal surface 1a, an N− type drift layer 2 is stacked. The drift layer 2 is made of SiC and has an impurity concentration of $5\times10^{15}$ cm$^{-3}$ (±50%), which is lower dopant amount than the substrate 1. A SBD structure 10 is formed in a cell region provided by the substrate 1 and the drift layer 2. A terminal structure is formed on an outer periphery region of the SBD structure 10. Thus, the semiconductor device includes the SBD structure 10 and the terminal structure.

Specifically, an insulation film 3 made of a silicon oxide film is formed on the surface of the drift layer 2. The insulation film 3 has an opening 3a, which is partially formed in the cell region. A Schottky electrode 4 is formed in the opening 3a of the insulation film 3. The Schottky electrode 4 contacts the drift layer 2. The Schottky electrode 4 is made of material, for example, Mo, Ti or Ni. The opening 3a has a circular shape, as shown in FIG. 2. The Schottky electrode 4 contacts the drift layer 2 with Schottky contact in the opening 3a. An ohmic electrode 5 is formed on the backside of the substrate 1. The ohmic electrode 5 is made of Ni, Ti, Mo, W or the like. Thus, the SBD structure 10 includes the ohmic electrode 5, the Schottky electrode 4, the drift layer 2 and the substrate 1 in the cell region.

The terminal structure includes a RESURF layer 6 having a P type and multiple guard rings 7 having the P type. The RESURF layer 6 is disposed in a surface portion of the drift layer 2, and contacts the Schottky electrode 4. The RESURF layer 6 is disposed on both sides of the Schottky electrode 4. The guard rings 7 surround the outer periphery of the RESURF layer 6. The RESURF layer 6 includes an impurity such as Al, and has an impurity concentration in a range between $5\times10^{16}$ cm$^{-3}$ and $1\times10^{18}$ cm$^{-3}$. The RESURF layer 6 and the guard rings 7 have a ring shape so that the ring shape surrounds the cell region, as shown in FIG. 2. By forming the RESURF layer 6 and the guard rings 7, electric field can extend widely toward the outer periphery of the SBD structure 10 so that the electric field concentration is reduced. Thus, the breakdown voltage of the device increases.

The P type layer 8 is formed on an inner side of an inner edge of the RESURF layer 6. The inner edge of the RESURF layer 6 in the terminal structure is disposed on a cell region side. The P type layer 8 contacts the Schottky electrode 4. A PN diode is provided by the P type layer 8 and the N− type drift layer 2. Thus, the JBS structure is formed. The P type layer 8 has a ring shape, which is formed along with the outer periphery of the cell region, i.e., the outer periphery of the Schottky electrode 4. A center portion 8a of the P type layer 8 having a circular shape is disposed at a center of a contact region between the Schottky electrode 4 and the drift layer 2. Specifically, the center portion 8a is disposed at the center of the cell region. Multiple ring portions 8b-8e are concentrically arranged around the center portion 8a. In this embodiment, the number of the ring portions 8b-8e is four. An utmost outer ring portion 8e is disposed on an utmost outer periphery of the P type layer 8. The utmost outer ring portion 8e contacts the inner side of the RESURF layer 6 or embedded in the inside of the RESURF layer 6. Middle ring portions 8b-8d disposed between the center portion 8a and the utmost outer ring portion 8e are symmetrically arranged along with a cross section in a radial direction around the center portion 8a. Thus, the middle ring portions 8b-8d and the utmost outer ring portion 8e are spaced apart from each other at predetermined intervals W1. Further, a width W2 of each ring portion 8b-8e and the center portion 8a is the same. Each portion 8a-8e has an impurity concentration in a range between $5\times10^{17}$ cm$^{-3}$ and $1\times10^{20}$ cm$^{-3}$. The interval W1 is about 2.0 µm±0.5 µm, and the width W2 is about 1.5 µm±0.5 µm.

The P type layer 8 has a depth, which is larger than that of the RESURF layer 6 and the guard ring layer 7. For example, the depth of each of the center portion 8a and the ring portions 8b-8e is in a range between 0.7 µm and 1.5 µm, which is large by 0.2 µm to 1.0 µm than the depth of the RESURF layer 6 and the guard ring layer 7.

In the device having the JBS structure, the Schottky electrode 4 provides an anode, and the ohmic electrode 5 provides a cathode. When a voltage more than a Schottky barrier voltage is applied to the Schottky electrode 4, the current flows between the Schottky electrode 4 and the ohmic electrode 5.

In the outer periphery region, when the diode is off, a depletion layer extends from the P type layer 8 to the drift layer 2, which are disposed under the Schottky electrode 4. The depletion layer fully depletes the drift layer 2 sandwiched between the P type layer 8 by the depletion layer. Thus, when surge generates in the device, i.e., when a reverse voltage is applied to the device, a leak current is reduced.

Figure 3:
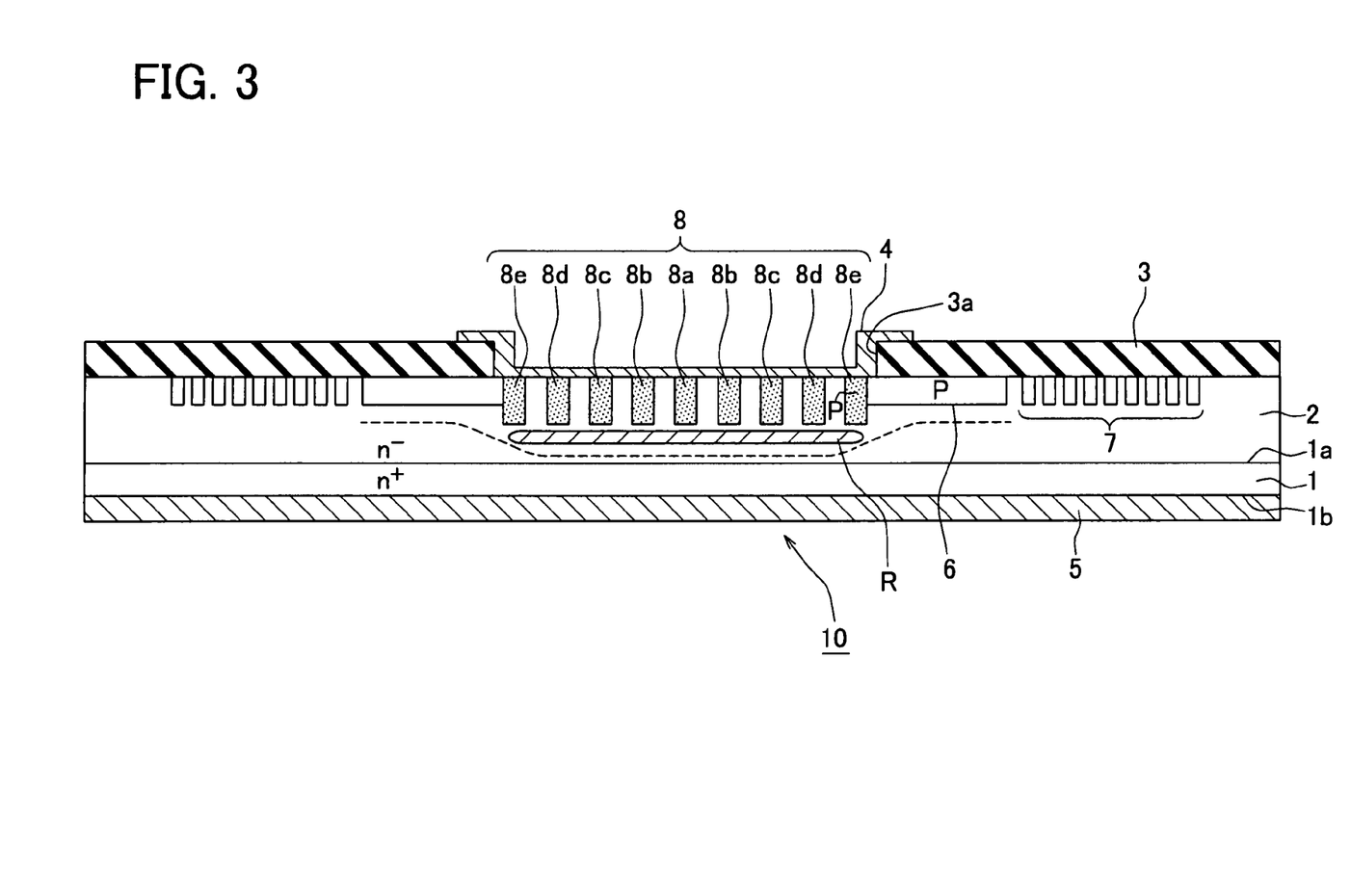
FIG. 3 is a cross sectional view showing a depletion layer in the SiC semiconductor device when surge occurs.

Since the depth of each of the center portion 8a and the ring portions 8b-8e is larger than that of the RESURF layer 6 and the guard ring layer 7, the depletion layer near the SBD 10 is provided in FIG. 3 when a voltage or a current more than a predetermined rated value is applied to the device, i.e., when surge occurs. In this case, the edge of the depletion layer becomes deeper in the drift layer 2. Thus, compared with a depletion layer in a conventional device shown in FIG. 11, the depletion layer is moved apart from the Schottky electrode 4. Thus, the electric field is concentrated on a whole region under the P type layer, which is defined as a region R in FIG. 3. Thus, a surge current flows through a PN diode homogeneously, so that the surge withstand voltage becomes high.

The method for manufacturing the SiC semiconductor device will be explained as follows. In FIGS. 4A to 4E, the P type guard ring layer 7 is not shown.

Figure 4A:
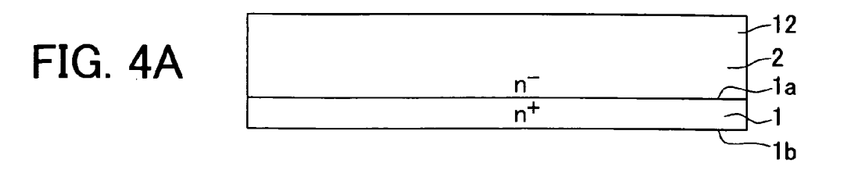
FIGS. 4A to 4E are partially enlarged cross sectional views showing a method for manufacturing the SiC semiconductor device.
Figure 4B:
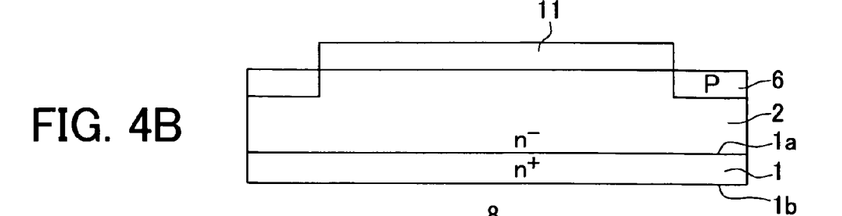

In a step shown in FIG. 4A, the drift layer 2 is formed on the principal surface 1a of the substrate 1 by an epitaxial growth method. In a step shown in FIG. 4B, a mask 11 made of a LTO (i.e., low temperature oxide) film is formed on the drift layer 2. Then, a part of the mask 11 is opened by a photo lithography etching method. The part of the mask 11 corresponds to a RESURF-layer-to-be-formed region and a guard-ring-to-be-formed region. By using the mask 11, a P type impurity such as Al is implanted on the drift layer 2, and then, the impurity is activated by a thermal process. Thus, the P type RESURF layer 6 and the P type guard ring layer 7 are formed.

Figure 4C:
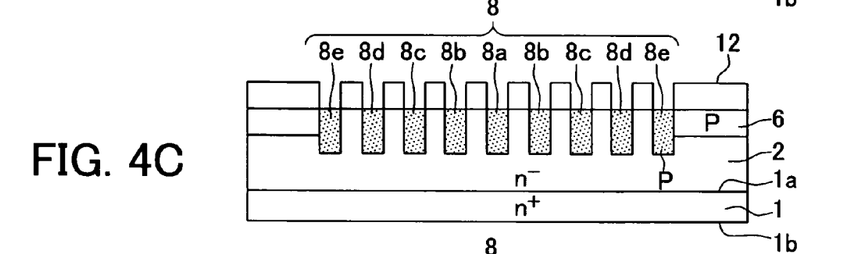

In FIG. 4C, the mask 11 is removed, and then, another mask 12 made of a LTO film or the like is formed on the drift layer 2. A part of the mask 12 is opened by a photo lithography etching method. The part of the mask 12 corresponds to a P-type-layer-to-be-formed region. By using the mask 12, a P type impurity such as Al is implanted on the drift layer 2, and then, the impurity is activated by a thermal process. Thus, the P type layer 8 is formed. At this time, ion implantation energy in a P type layer forming process is higher than that in a P type RESURF layer and P type guard ring layer forming process so that the P type impurity is deeply implanted in the drift layer 2.

Figure 4D:
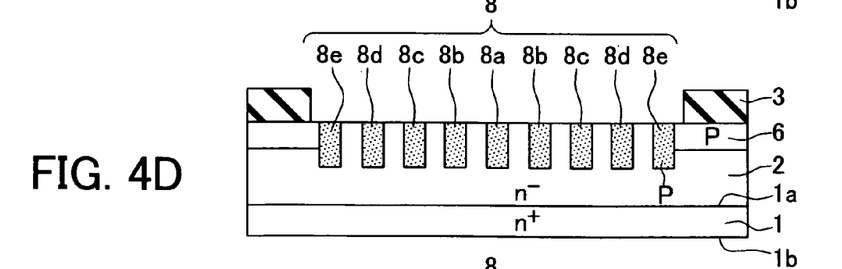

In a step shown in FIG. 4D, the mask 12 is removed. Then, a metallic layer made of, for example, Ni, Ti, Mo, W or the like is formed on the backside 1b of the substrate 1. Thus, the ohmic electrode 5 is formed. The SiC surface of the substrate 1 is cleaned by a sacrifice oxidation process, and then, a silicon oxide film is formed on substrate 1 by a plasma CVD method. The silicon oxide film is processed under a reflow process so that the insulation film 3 is deposited. Then, the insulation film 3 is etched in the photo lithography etching process so that the opening 3*a* is formed in the insulation film 3.

Figure 4E:
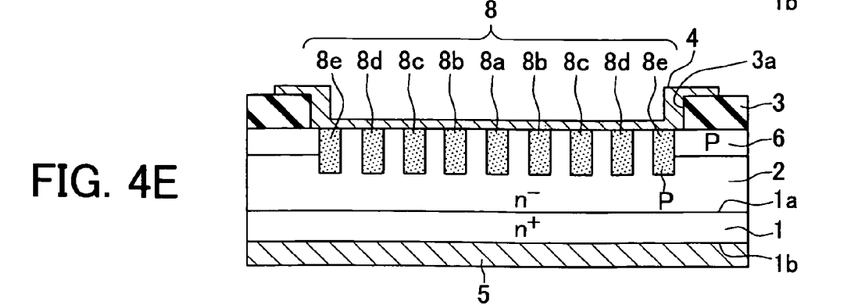

In a step shown in FIG. 4E, another metallic film made of Mo, Ti or Ni is formed on the insulation film 3 and in the opening 3*a*. The metallic film is patterned so that the Schottky electrode 4 is formed. Thus, the Schottky electrode 4 is formed. The SiC semiconductor device having the JBS diode is completed.

In the SiC semiconductor device, multiple portions of the P type layer 8 are arranged in the drift layer 2 under the Schottky electrode 4, and the depth of each portion of the P type layer 8 is larger than that of the RESURF layer 6 and the guard ring layer 7, which provide the terminal structure.

Thus, whole of the region R under the P type layer 8 can receive the electric field concentration, so that the surge current flows homogeneously through the whole PN diode. Thus, the device has a high surge withstand voltage.

Second Embodiment

Figure 5:
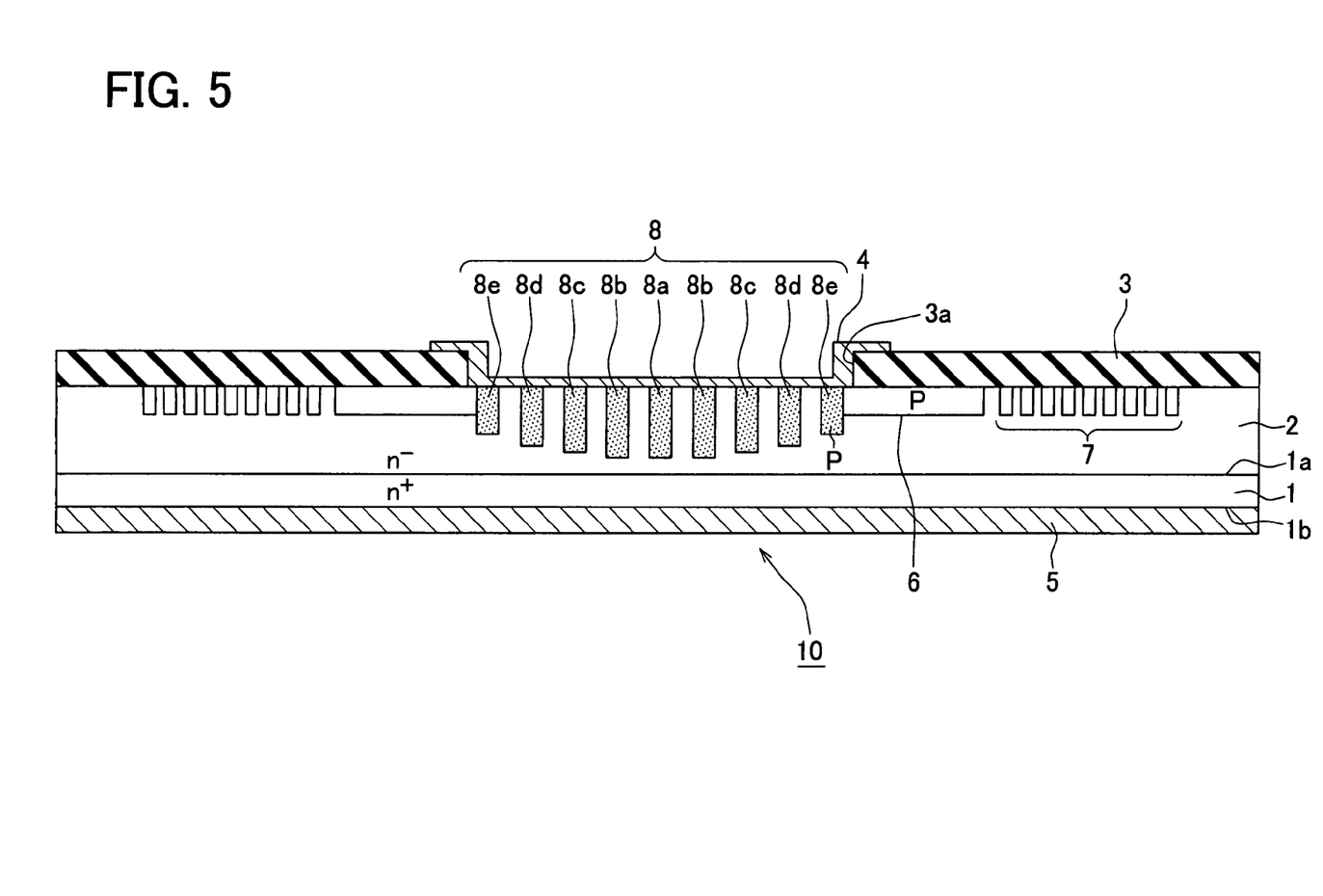
FIG. 5 is a cross sectional view showing a SiC semiconductor device having a JBS structure according to a second embodiment.

FIG. 5 shows a SiC semiconductor device having a JBS diode according to a second embodiment.

The depth of the P type layer 8 becomes larger as it goes to the center of the contact region between the Schottky electrode 4 and the drift layer 2. Near the center of the contact region, the depth of the P type layer 8 is uniformed. Thus, near the center of the contact region, the edge of the depletion layer can be lowered, i.e., the depletion layer is extended deeply in the drift layer 2. Thus, the electric field concentration at the boundary between the terminal structure and the P type layer 8 is reduced, so that the surge withstand voltage increases.

The manufacturing method of the device shown in FIG. 5 is similar to that in FIG. 1. Specifically, in the step shown in FIG. 4C, multiple masks 12 are prepared, and each mask 12 corresponds to the portion 8*a*-8*e* of the P type layer 8, which has the same depth. Therefore, the masks 12 are prepared with respect to different depth of the portions 8*a*-8*e* of the P type layer 8, and the ion implantation is performed in series.

Third Embodiment

Figure 6:
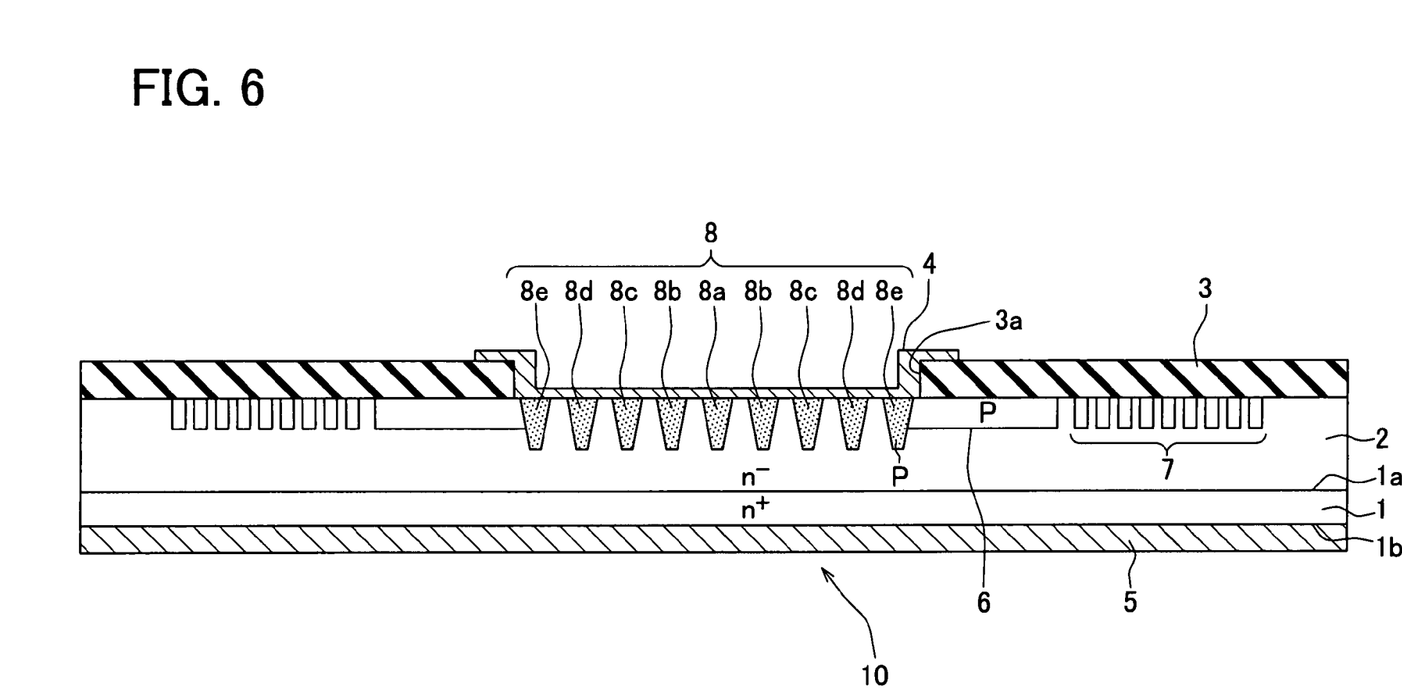
FIG. 6 is a cross sectional view showing a SiC semiconductor device having a JBS structure according to a third embodiment.

FIG. 6 shows a SiC semiconductor device having a JBS diode according to a third embodiment.

Each portion 8*a*-8*e* of the P type layer 8 has a tapered cross section, thereby, a width of the cross section becomes larger as it goes to the surface of the drift layer. Here, the width corresponds to a dimension on the surface of the substrate 1. Specifically, the contact portion of the P type layer 8 has the width larger than a deeper portion of the P type layer 8. In this case, the area of the contact portion between the Schottky electrode 4 and the P type layer 8 increases, so that resistance of the P type layer 8 is reduced. Thus, the device has a high surge withstand voltage.

The manufacturing method of the device shown in FIG. 6 is similar to that in FIG. 1. Specifically, in the step shown in FIG. 4C, the mask 12 is processed by combination of a wet-etching method and a dry-etching method so that the sidewall of the opening of the mask 12 has a tapered shape. The mask processing technique for forming the tapered sidewall is well known.

Fourth Embodiment

Figure 7:
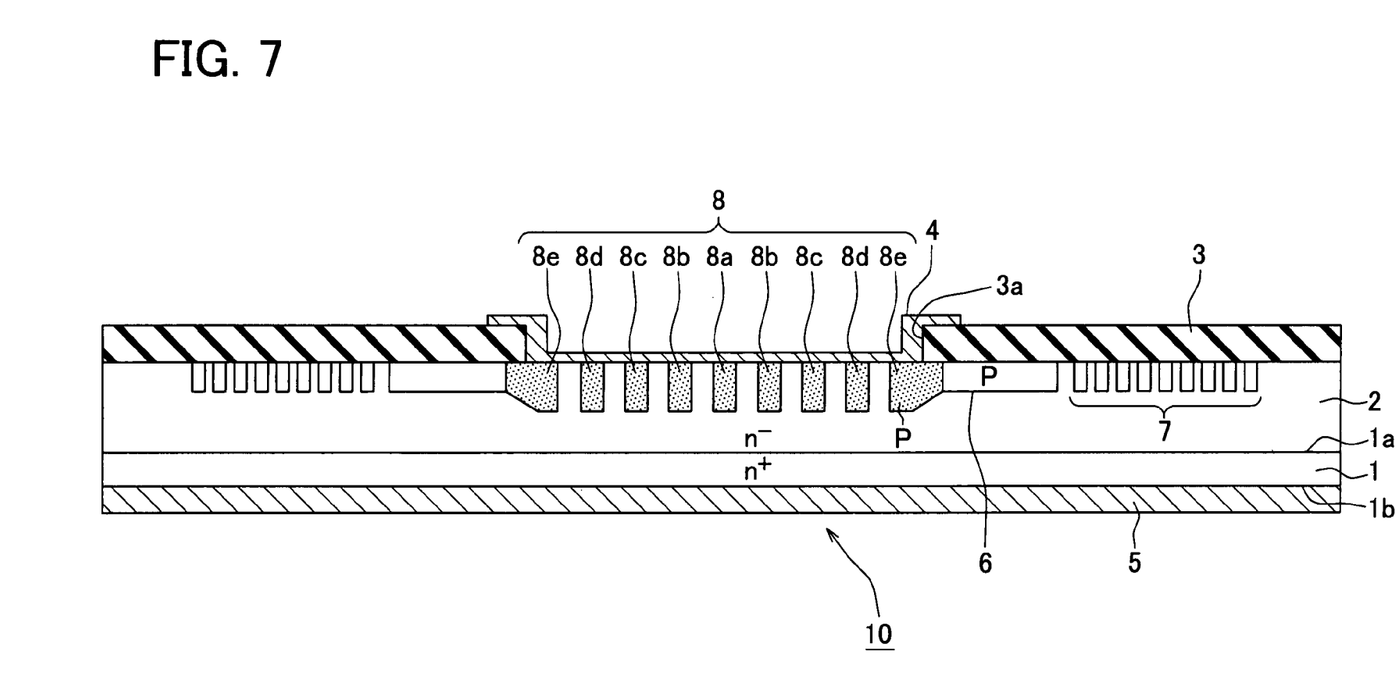
FIG. 7 is a cross sectional view showing a SiC semiconductor device having a JBS structure according to a fourth embodiment.

FIG. 7 shows a SiC semiconductor device having a JBS diode according to a third embodiment.

The utmost outer ring portion 8*e*, which is disposed on the most nearest side of the RESURF layer 6, has a tapered portion so that the depth of the utmost outer ring portion 8*e* becomes smaller as it goes to the outside of the Schottky electrode 4. Thus, the depth of the utmost outer ring portion 8*e* continuously reduced to the depth of the RESURF layer 6. In this case, the shape of the depletion layer at the boundary between the utmost outer ring portion 8*e* and the RESURF layer 6 becomes smooth, compared with the device shown in FIG. 1 when the surge occurs. Thus, the electric field concentration at the boundary between the utmost outer ring portion 8*e* and the RESURF layer 6 is reduced, so that the device has high surge withstand voltage.

Figure 8A:
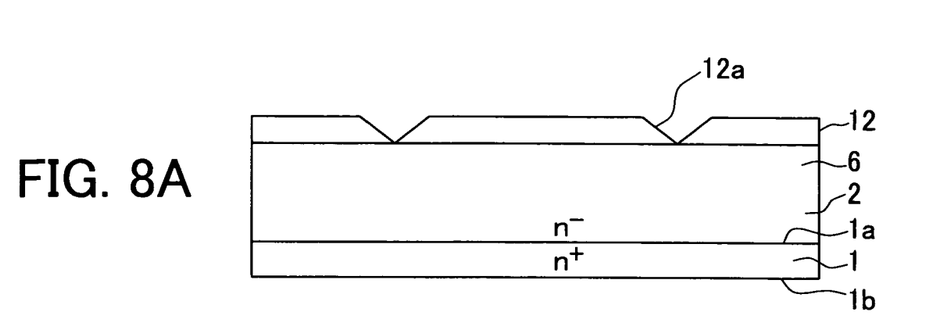
FIGS. 8A to 8C are partially enlarged cross sectional views showing a method for manufacturing the SiC semiconductor device shown in FIG. 7.
Figure 8B:
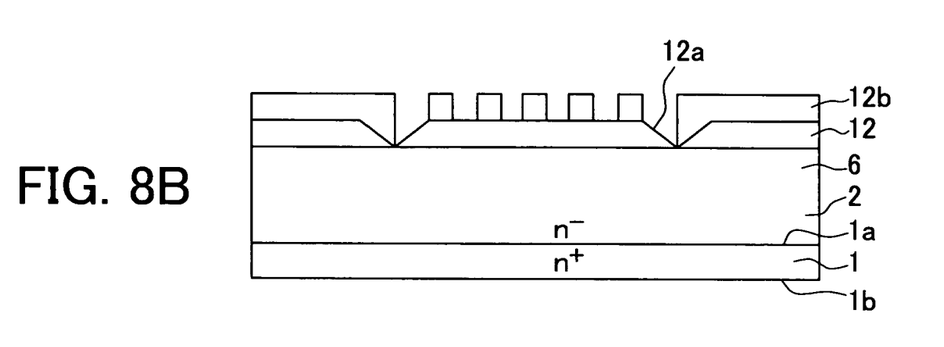
Figure 8C:
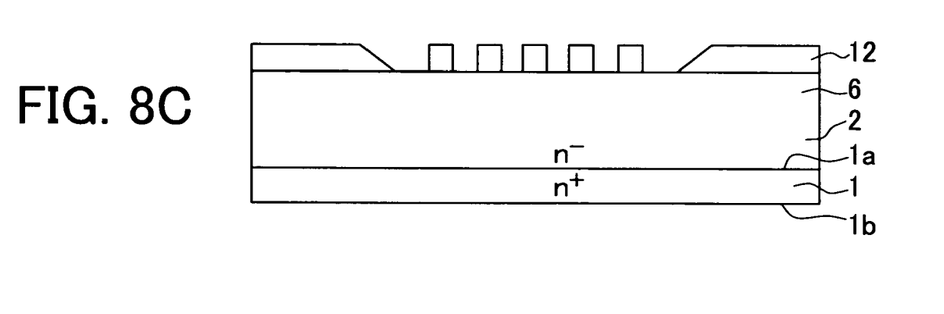

The manufacturing method of the device shown in FIG. 6 is similar to that in FIG. 1. Specifically, in the step shown in FIG. 4C, the mask 12 has a partial tapered portion. FIGS. 8A to 8C show a forming step of the mask 12. An opening of the mask 12 corresponding to the utmost outer ring portion 8*e* has a tapered sidewall disposed on the outside. First, as shown in FIG. 8A, a tapered groove 12*a* is formed at a part of the mask 12 by combination of a wet-etching method and a dry-etching method. The part of the mask 12 corresponds to the utmost outer ring portion 8*e*. As shown in FIG. 8B, a resist mask 12*b* is arranged to cover the tapered portion of the groove 12*a* for providing the tapered sidewall of the mask 12 disposed on the outside. Then, an opening is formed in the resist mask 12*b* by an anisotropic etching method such as a dry-etching method. Then, as shown in FIG. 8C, the resist mask 12*b* is removed. Thus, the sidewall of the opening on the outside corresponding to the utmost outer ring portion 8*e* is processed to have a tapered shape. By using the mask 12, a P type impurity is implanted on the drift layer 2, so that the utmost outer ring portion 8*e* shown in FIG. 7 is formed.

Fifth Embodiment

Figure 9:
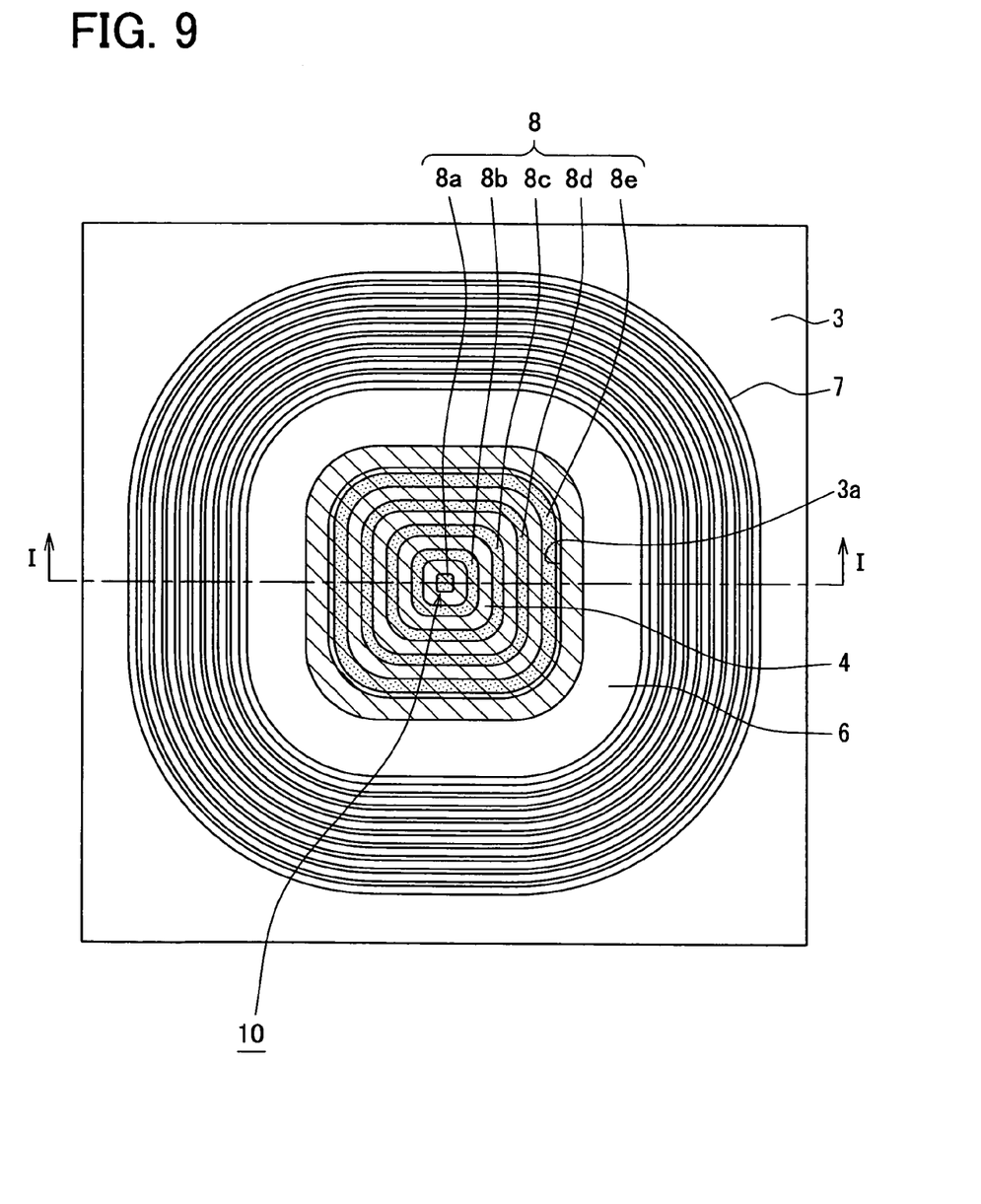
FIG. 9 is an upper layout view showing a SiC semiconductor device according to a fifth embodiment.

FIG. 9 shows a SiC semiconductor device having a JBS structure according to a fifth embodiment. The JBS structure and the outer periphery structure in FIG. 9 are different from those in FIG. 2. In FIG. 9, the RESURF layer 6 has a square shape with four rounded corners. The P type layer 8 including the center portion 8*a* and multiple ring portions 8*b*-8*e* has a square shape with four rounded corners. Specifically, the center portion 8*a* has the square shape with rounded corners, and each of the ring portions 8*b*-8*e* has the square shape with rounded corners, which surrounds the center portion 8*a*.

Sixth Embodiment

Figure 10:
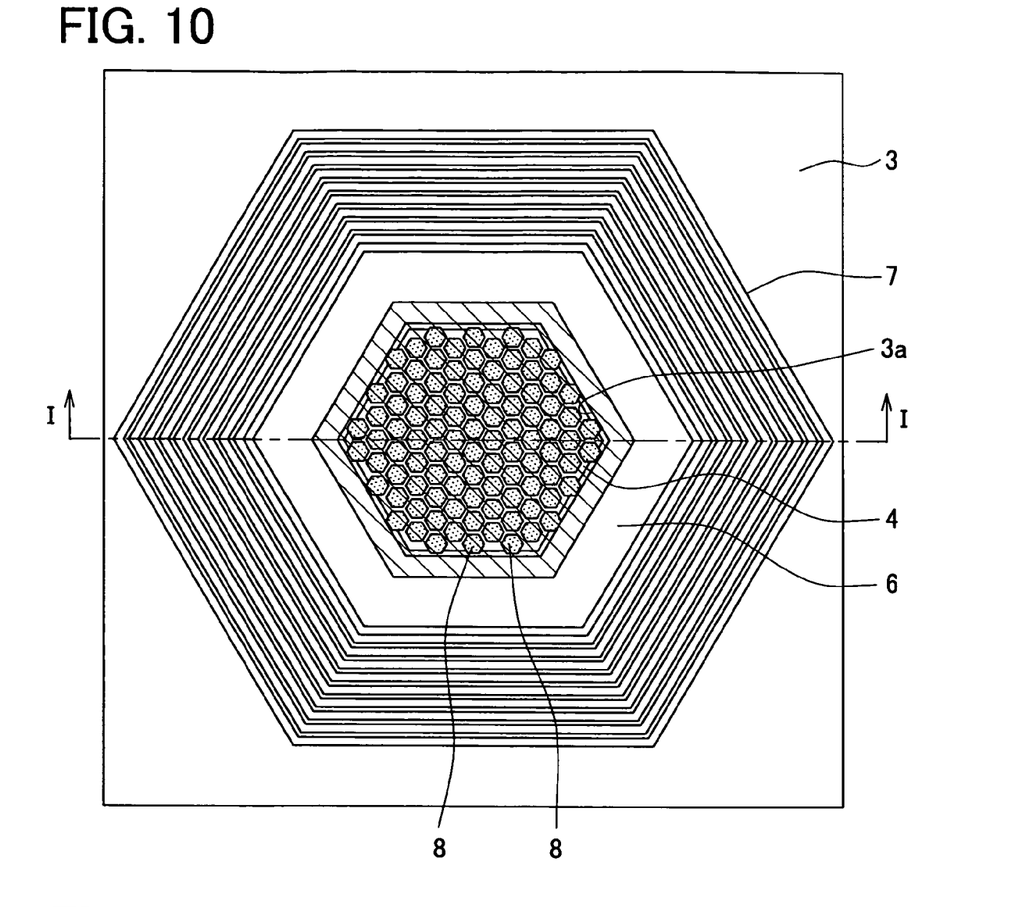
FIG. 10 is an upper layout view showing a SiC semiconductor device according to a sixth embodiment.

FIG. 10 shows a SiC semiconductor device having a JBS structure according to a sixth embodiment. The JBS structure and the outer periphery structure in FIG. 10 are different from those in FIG. 2.

The RESURF layer 6 has a hexagonal shape, and the P type layer 8 includes multiple honey comb structure. Each honey comb has a hexagonal shape. The P type layer 8 is disposed inside of the RESURF layer 6. Each honey comb has the same dimensions, and a distance between two adjacent honey combs is the same. Specifically, a part of the drift layer 2 sandwiched between two adjacent honey combs has an equivalent width. The honey combs have the point symmetry around the center of the Schottky electrode 4. Although the number of honey combs along with line I-I in FIG. 10 is six, the number of honey combs may be different from six.

(Modifications)

The number of the center portion 8*a* and the ring portions 8*b*-8*e* may be different from that in FIGS. 1-10. Although the shape of the RESURF layer 6 and the P type layer 8 is the square shape with the rounded corners in FIG. 7, the shape of the RESURF layer 6 and the P type layer 8 may be a polygonal with rounded corners. The P type layer 8 may have a stripe pattern shape, and the depth of the P type layer 8 may be larger than that of the RESURF layer 6.

The first conductive type is the N type, and the second conductive type is the P type. Alternatively, the first conductive type may be the P type, and the second conductive type may be the N type.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device having a junction barrier Schottky diode comprising:
    a SiC substrate having a first conductive type and including first and second surfaces;
    a drift layer having the first conductive type, disposed on the first surface of the substrate, made of SiC, and having an impurity concentration, which is lower than that of the substrate;
    an insulation film disposed on the drift layer and having an opening in a cell region;
    a Schottky barrier diode having a Schottky electrode and an ohmic electrode, wherein the Schottky electrode is disposed in the cell region and contacts the drift layer through the opening of the insulation film with Schottky contact, and wherein the ohmic electrode is disposed on the second surface of the substrate;
    a terminal structure having a RESURF layer and disposed on an outer periphery of the cell region, wherein the RESURF layer has a second conductive type, surrounds the cell region, and is disposed in a surface portion of the drift layer; and
    a plurality of second conductive type layers, each of which is disposed in another surface portion of the drift layer on an inner side of the RESURF layer, contacts the Schottky electrode, wherein the second conductive type layers are separated from each other by a predetermined distance, wherein:
    the plurality of second conductive type layers and the drift layer provide a PN diode;
    each second conductive type layer has a depth, which is larger than a depth of the RESURF layer;
    the plurality of second conductive type layers includes a first layer and a second layer;
    the first layer is disposed in a center portion of the cell region, and the second layer is disposed in an outside portion of the cell region; and
    the first layer has a depth, which is larger than a depth of the second layer.

2. The semiconductor device according to claim 1, wherein:
    the plurality of second conductive type layers includes a plurality of first layers, which are disposed in a center portion of the cell region; and
    the first layers have substantially the same depth.

3. The semiconductor device according to claim 1, wherein:
    the plurality of second conductive type layers includes a center layer and a plurality of ring layers;
    the center layer is disposed at a center of the cell region;
    each of the ring layers surrounds the center layer and has a point symmetry around the center layer;
    the plurality of ring layers includes an utmost outer ring layer, which is disposed on an utmost outer side of the ring layers;
    the plurality of ring layers includes a plurality of middle ring layers, which is disposed between the utmost outer ring layer and the center layer;
    each ring layer has a cross section taken along a radial direction of the cell region; and
    the cross sections of the middle ring portions have a line symmetry with respect to the center of the cell region.

4. The semiconductor device according to claim 3, wherein:
    the ring layers are concentrically arranged around the center layer.

5. The semiconductor device according to claim 3, wherein:
    the terminal structure further includes a plurality of guard rings, each of which has the second conductive type; and
    each guard ring surrounds the RESURF layer, and is disposed in further another surface portion of the drift layer.

6. The semiconductor device according to claim 3, wherein:
    the center layer has a circular shape with respect to a planar shape, which is in parallel to the first surface of the substrate; and
    each ring layer has a circular shape with respect to the planar shape.

7. The semiconductor device according to claim 3, wherein:
    the utmost outer ring layer contacts an inner edge of the RESURF layer or is embedded in the RESURF layer.

* * * * *

UNITED STATES PATENT AND TRADEMARK OFFICE
CERTIFICATE OF CORRECTION

| | | |
|---|---|---|
| PATENT NO. | : 7,816,733 B2 | Page 1 of 1 |
| APPLICATION NO. | : 12/078370 | |
| DATED | : October 19, 2010 | |
| INVENTOR(S) | : Eiichi Okuno et al. | |

It is certified that error appears in the above-identified patent and that said Letters Patent is hereby corrected as shown below:

Title page

Item (54) and column 1, line 1, Title should read:

SIC SEMICONDUCTOR DEVICE HAVING JUNCTION BARRIER SCHOTTKY DIODE

Signed and Sealed this
Twenty-eighth Day of December, 2010

David J. Kappos
*Director of the United States Patent and Trademark Office*